(12) United States Patent
Houssameddine et al.

(10) Patent No.: US 11,621,026 B2
(45) Date of Patent: Apr. 4, 2023

(54) WRITE DRIVER WITH MAGNETIC FIELD COMPENSATION

(71) Applicant: INTERNATIONAL BUSINESS MACHINES CORPORATION, Armonk, NY (US)

(72) Inventors: Dimitri Houssameddine, White Plains, NY (US); Kotb Jabeur, Essex junction, VT (US); Eric Robert Joseph Edwards, Boston, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 185 days.

(21) Appl. No.: 17/108,411

(22) Filed: Dec. 1, 2020

(65) Prior Publication Data
US 2022/0172763 A1 Jun. 2, 2022

(51) Int. Cl.
*G11C 11/00* (2006.01)
*G11C 11/16* (2006.01)

(52) U.S. Cl.
CPC ........ *G11C 11/1675* (2013.01); *G11C 11/161* (2013.01); *G11C 11/1659* (2013.01)

(58) Field of Classification Search
CPC .................................................. G11C 11/1675
See application file for complete search history.

(56) References Cited

U.S. PATENT DOCUMENTS

| | | | |
|---|---|---|---|
| 7,453,747 B2 | 11/2008 | Abraham et al. | |
| 8,134,881 B2 | 3/2012 | Boeve | |
| 8,634,232 B2 | 1/2014 | Oh | |
| 8,848,431 B2 * | 9/2014 | Katti | G11C 11/1673 365/158 |
| 8,984,379 B2 | 3/2015 | Andre et al. | |
| 9,368,179 B2 | 6/2016 | Katti et al. | |
| 9,443,113 B2 | 9/2016 | Alam et al. | |
| 9,805,444 B2 * | 10/2017 | Lee | G11C 11/161 |
| 10,672,832 B2 | 6/2020 | Ying et al. | |
| 2014/0043892 A1 * | 2/2014 | Lee | G11C 11/16 365/158 |
| 2019/0140020 A1 | 5/2019 | Ying et al. | |

FOREIGN PATENT DOCUMENTS

EP 1692704 B1 5/2007

OTHER PUBLICATIONS

International Search Report issued in related case EP2021/082001, dated Feb. 23, 2022, 17 pages.

* cited by examiner

*Primary Examiner* — Min Huang
(74) *Attorney, Agent, or Firm* — Tutunjian & Bitetto, P.C.; Daniel Morris

(57) ABSTRACT

A method for compensating for external magnetic fields in memory devices that includes positioning at least one external magnetic field sensing element adjacent to at least one array of memory cells, wherein a write driver is in electrical communication with at least one external magnetic field sensing element and at least one array of memory cells. The at least one external magnetic field sensing element is monitored for signals indicative of the present of an external magnetic field. The write current to the at least one array of memory cells can be adjusted by trimming the write driver to operate the memory device while compensating for the external magnetic field.

22 Claims, 10 Drawing Sheets

WRITE DRIVER WITH MAGNETIC FIELD COMPENSATION

BACKGROUND

The present invention generally relates to memory devices, and more particularly, to a magnetic random access memory (MRAM) and a layout structure thereof including a write driver.

A magnetic random access memory (MRAM) stores digital information utilizing the resistance variation related to polarity change of a magnetic substance. In some instances, sensitivity to external magnetic field can negatively impact MRAM performance, which can lead to unrecoverable failure.

Costly and complex shielding solutions have been proposed to allow for MRAM products to operate in presence of an external field. Other solutions have been proposed to shut down the chip operation if the presence of an external magnetic field that would alter the data or memory operation is detected. For example, designs have been proposed that include magnetic field sensors. Additionally, watch cells may be incorporated with the MRAMs, in which the watch cells are Magnetic Tunnel Junction elements with a lower switching field than the MRAM bits. In these designs, the system periodically reads the state of the watch cells to determine the presence of an external fields, and adjusts the performance of the MRAMs accordingly. Such solutions might not be acceptable for high performance applications.

SUMMARY

In accordance with an embodiment of the present invention, a method for compensating for external magnetic fields in memory devices is provided that includes positioning at least one external magnetic field sensing element adjacent to at least one array of memory cells, wherein a write driver is in electrical communication with at least one external magnetic field sensing element and at least one array of memory cells. The method continues with monitoring the at least one external magnetic field sensing element for signals indicative of the presence of an external magnetic field, and adjusts a write current to the at least one array of memory cells by trimming the write driver. By adjusting the write current, the method advantageously allows for the memory cells to function in a external magnetic field, whereas previous methods discontinued the operation of memory cells when an external magnetic field was present.

In some embodiments, the array of memory cells includes bit cells having a bit cell magnetic tunnel junction (MTJ). The at least one external magnetic field sensing element may be a magnetic field sensor or a watch cells. In some examples, watch cells have the advantage of being positioned closely to the bit cells and may be formed using similar processing. To provide for a watch cell, a watch cell magnetic tunnel junction (MTJ) structure may be provided having a greater diameter than the bit cell magnetic tunnel junction (MTJ). It is noted that this applies to only some embodiments of the methods and structures described herein. In other examples, the watch cell includes a watch cell magnetic tunnel junction having magnetic anisotropy field (Hk) characteristics different from magnetic anisotropy field (Hk) characteristics of the bit cell magnetic tunnel junction (MTJ). These examples have the advantages as having a similar geometry as the bit cells, which facilitates their integration into design. In yet other embodiments, the watch cell includes a watch cell access transistor to the watch cell magnetic tunnel junction that is designed or biased to provide less write current than the bit cell access transistors.

In some embodiments, the step of monitoring the at least one external magnetic field sensing element for signals indicative of the present of an external magnetic field includes measuring programming of a watch cell when a bit cell is not correspondently programmed at a substantially same time. In other embodiments, monitoring the at least one external magnetic field sensing element for signals indicative of the present of an external magnetic field includes measuring changes in write error rate (WER) of the watch cells.

In another embodiment, a method for compensating for external magnetic fields in memory devices is provided that includes positioning at least one watch cell adjacent to at least one array of memory cells, wherein a write driver is in electrical communication with at least one external magnetic field sensing element and at least one array of memory cells. The method further includes monitoring the at least one watch cell for variations in write error rate (WER) from a baseline write error rate. In this example, the variation in the write error rate of the watch cells signal the present of an external magnetic field. The method adjusts the write current to the at least one array of memory cells by trimming the write driver to compensate for the external magnetic fields measured by monitoring the at least one watch cell.

In another aspect of the present disclosure, a memory device is provided that advantageously allows for detecting an external magnetic field, and adjusting write current to allow for the memory cell to continue to operate while compensating for the external magnetic field. In one embodiment, the memory device includes at least one block of bit cells including a plurality of memory cells and at least one supplemental column of watch cells. The at least one supplement column of watch cells measures external magnetic fields in proximity to the plurality of memory cells. The memory device further includes a write driver circuit in electrical communication with at least the plurality of memory cells. The memory device further includes a counter for recording when the at least one supplemental column of watch cells measures the external magnetic fields, the counter is in electrical communication with the write driver circuit. The write driver of the write driver circuit adjusts a write current to the plurality of memory cells to compensate for the external magnetic field. By adjusting the write current, the method advantageously allows for the memory cells to function in an external magnetic field, whereas previous devices discontinued the operation of memory cells when an external magnetic field was present.

In one embodiment of the memory device, the plurality of memory cells includes bit cells having a bit cell magnetic tunnel junction (MTJ), and the watch cells includes a watch cell magnetic tunnel junction (MTJ) structure having a greater diameter than the bit cell magnetic tunnel junction (MTJ). In another embodiment, the watch cells have a watch cell magnetic tunnel junction having magnetic anisotropy field (Hk) characteristics different from magnetic anisotropy field (Hk) characteristics of the bit cell magnetic tunnel junction (MTJ). In yet another embodiment, the watch cell comprises a watch cell access transistor to a watch cell magnetic tunnel junction that is designed or biased to provide less write current than the bit cell access transistors.

The watch cells can be positioned in a supplemental column of a block of bit cell arrays. This advantageously provides that the watch cells can be processed as the same time as the bit cells, which facilitates the integration of the watch cells into the memory device. In the examples, in which the watch cells have a different diameter than the bit cells, the bit cells can be arranged in a plurality of blocks of arrays, and the watch cell having the greater diameter than the bit cell magnetic tunnel junction (MTJ) are positioned in a supplemental row with an increasing degree of variation for each block in the plurality of blocks of arrays.

In another aspect, a memory device is provided that includes at least one block of bit cells including a plurality of memory cells and at least one supplemental group of watch cells in periphery of the memory array. The at least one supplement group of watch cells measures external magnetic fields in proximity to the plurality of memory cells. The plurality of memory cells comprises bit cells having a bit cell magnetic tunnel junction (MTJ), and the supplemental group of watch cells include a magnetic tunnel junction (MTJ) structure having a greater diameter than the bit cell magnetic tunnel junction (MTJ). The memory device may further include a write driver circuit in electrical communication with at least the plurality of memory cells. The write driver of the write driver circuit adjusts the write current to the plurality of memory cells to compensate for the external magnetic field. In some embodiments, the watch cells are positioned in periphery of a block of bit cell arrays.

In yet another aspect, a memory device is provided that includes at least one block of bit cells including a plurality of memory cells and at least one supplemental group of watch cells in periphery of the memory array. The at least one supplement group of watch cells measures external magnetic fields in proximity to the plurality of memory cells. The plurality of memory cells include bit cells having a bit cell magnetic tunnel junction (MTJ), and the watch cells include a watch cell magnetic tunnel junction having magnetic anisotropy field (Hk) characteristics different from magnetic anisotropy field (Hk) characteristics of the bit cell magnetic tunnel junction (MTJ). In some embodiments, the watch cells are positioned in periphery of a block of bit cell arrays.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

It has been determined, that magnetic random access memory (MRAM) memory can be sensitive to external magnetic fields that can negatively impact MRAM performance, and in some instances can lead to unrecoverable failure.

Figure 1:
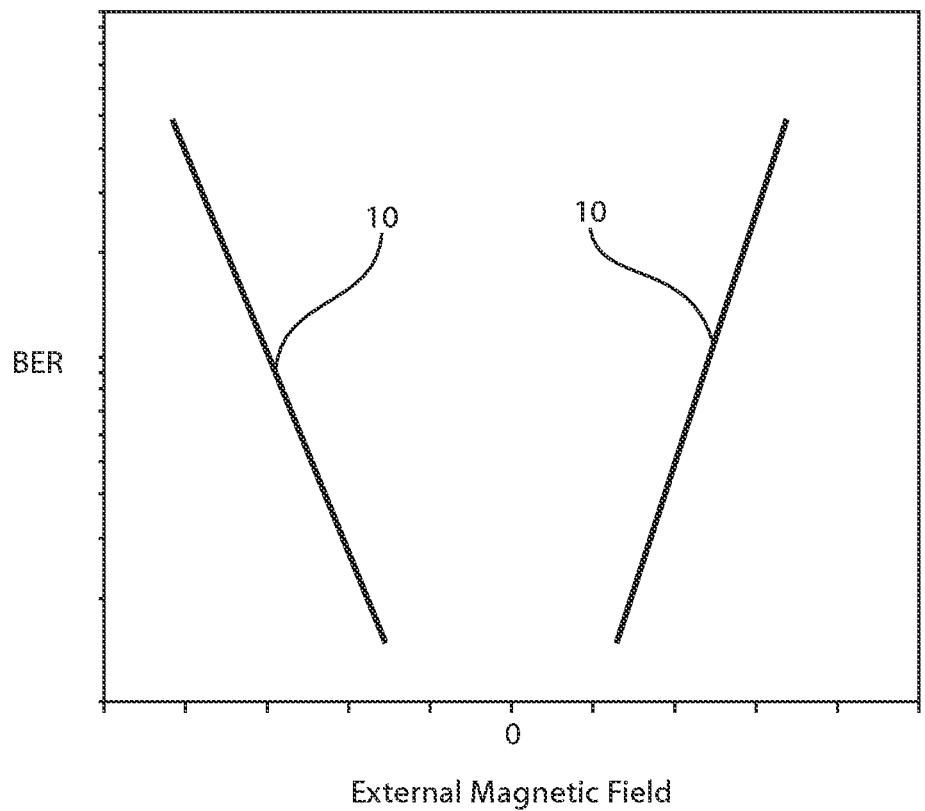
FIG. 1 is a plot illustrating the dependence of bit error rate (BER) of an MRAM device in the presence of an external magnetic field.

FIG. 1 is a plot illustrating the dependence of bit error rate (BER) of an MRAM device in the presence of an external magnetic field. The y-axis represents the bit error rate (BER), while the x-axis illustrates the strength of an external magnetic field. The plot line identified by reference number 10 illustrates that as the strength of the external magnetic field is increased, the bit error rate (BER) also increases. The data provided in FIG. 1 is produced from a high speed version of MRAM architecture that includes a cell with an access transistor and a MTJ (1T1MTJ) in the array. A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called "bottom pinned" configuration by sequentially depositing a seed layer, a ferromagnetic reference (or "pinned") layer, a thin tunnel barrier layer, a ferromagnetic "free" layer, and a capping layer One type of MRAM is spin-transfer torque (STT) MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. STT MRAM uses a two-terminal device with a magnetic tunnel junction (MTJ) pillar composed of a magnetic reference layer, a tunnel barrier layer, and a magnetic free layer. The magnetization of the magnetic reference layer is fixed in one direction and a current passed up through the MTJ pillar makes the magnetic free layer anti-parallel to the magnetic reference layer, while a current passed down through the MTJ pillar makes the magnetic free layer anti-parallel to the magnetic reference layer. Up and down are relative to the direction of the pinned layer. A smaller current (of either polarity) is used to read the resistance of the device, which depends on the relative orientations of the magnetic reference layer and the magnetic free layer.

The application of the external magnetic field can affect the magnetic tunnel junction energy barrier and modulates the switching voltage. As illustrated in FIG. 1, raising the magnetic tunnel junction (MTJ) switching voltage will result in an increased bit error rate (BER) at the array level. In some embodiments, when the number of bit errors, i.e., the bit error rate (BER), increases beyond the Error Correction Code (ECC) capability, the MRAM element of the cell will begin to generate potentially uncorrectable errors, which can lead to system failure.

Figure 2:
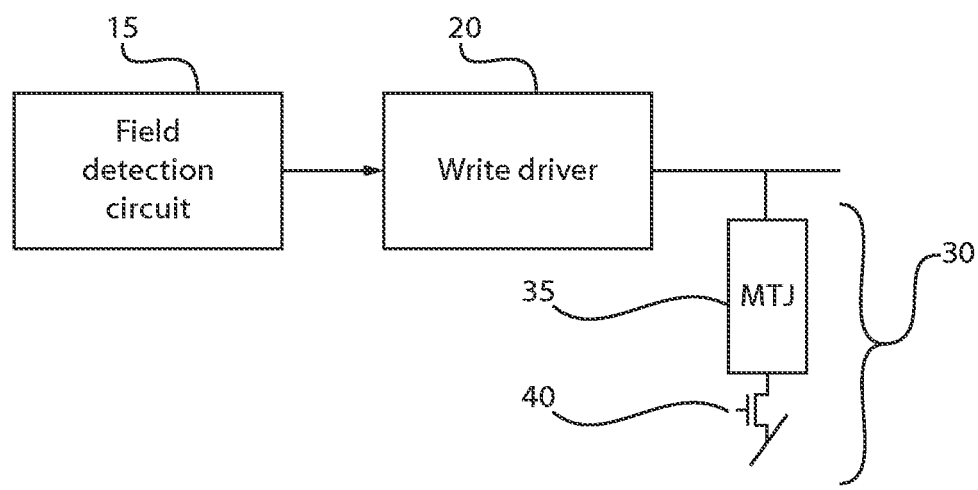
FIG. 2 is a schematic illustrating a schematic of a magnetic field detection circuit coupled to the write driver, in accordance with one embodiment of the present disclosure.

In some embodiments, the structures and methods of the present disclosure overcome the aforementioned sensitivity of MRAM memory arrays to external magnetic fields by coupling a magnetic field detection circuit to the write driver of the memory array including the MRAM elements. In some embodiments, using the field detection circuit 15, the write voltage to the driver circuit, i.e., write driver 20, may be adjusted based upon measurements of external magnetic field recorded by the field detection circuit 15, as depicted in FIG. 2. FIG. 2 is a schematic illustrating one embodiment of a magnetic field detection circuit 15 coupled to a write driver 20. The write driver 20 effectuates writing data to a memory cell 30, e.g., magnetic tunnel junction (memory element 35) and access transistor 40. The write driver 20 controls how the write current is provided through the MTJ and how the magnetic state of the MTJ is written, which stores data. The write driver 20 may include its own hardware processor and memory for commands that are configured for controlling the read and write functions of the memory device, as well as the application of write current to provide for magnetic field compensation.

Figure 3:
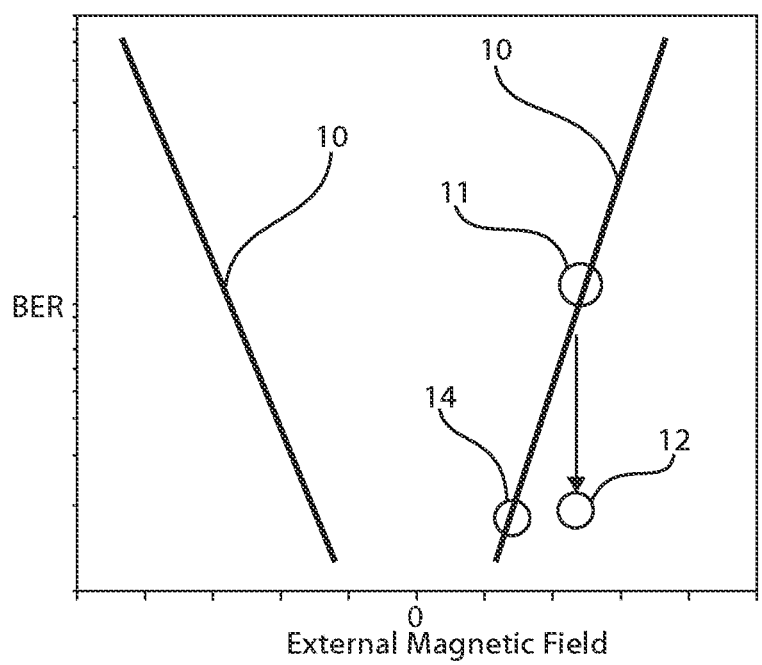
FIG. 3 is a plot illustrating how the field compensation can mitigate the bit error rate (BER) of an MRAM device in the presence of an external magnetic field, in accordance with one embodiment of the present disclosure.
Figure 4:
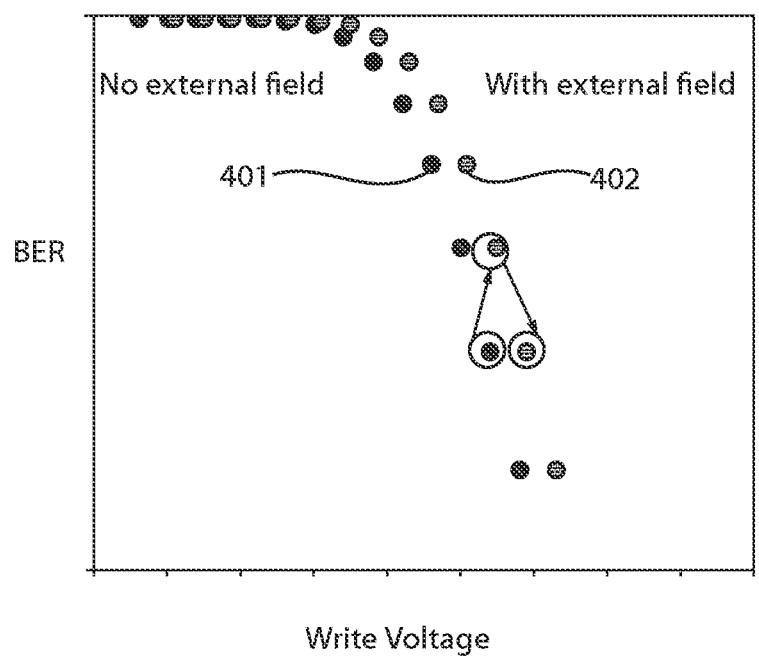
FIG. 4 is a plot illustrating write voltage shmoo with no external field and with a small applied field, in accordance with one embodiment of the present disclosure.

FIGS. 3 and 4 illustrate examples of how field compensation is achieved by adjusting the write voltage based upon the measurement of an external magnetic field. FIG. 3 is a plot illustrating how the field compensation can mitigate the bit error rate (BER) of an MRAM device in the presence of an external magnetic field. The y-axis of the plot depicted in FIG. 3 represents the bit error rate (BER), while the x-axis illustrates the strength of an external magnetic field. The plot line identified by reference number 10 in FIG. 3 illustrates that as the strength of the external magnetic field is increased, the bit error rate (BER) also increases. The plot point identified by reference number 11 illustrates a high bit error rate (BER) when a high external magnetic field is applied to the memory cell. This represents normal operation of the memory cell when an external magnetic field is applied to the memory cell, and field compensation is not actuated. As noted above, the methods and structures that are described herein, adjust the write voltage to compensate for external magnetic fields that increase the bit error rate (BER) of the memory cell. The plot point identified by reference number 12 illustrates a reduction in the bit error rate (BER) in scenarios in which the write voltage has been increased to compensate for the external magnetic field. As illustrated by the plot point having reference number 12, by increasing the write voltage through the write driver, the bit error rate (BER) of the memory cell when in the presence of an external magnetic field can be restored (reduced) to a level of normal operation, i.e., substantially equal to the bit error rate (BER), in the absence of an external magnetic field (as illustrated by plot point 14). Referring to FIG. 3, reference point 12 indicates that the bit error rate (BER) for a memory cell has been reduced from a high number of bit errors to a substantially low number of bit errors.

FIG. 4 is a plot illustrating write voltage shmoo with no external field and with a small applied field, in accordance with one embodiment of the present disclosure. Referring to FIG. 4, the reference number 401 represents data points for the array write characteristics when no magnetic field is applied and reference number 402 represents data points for the array write characteristics when a magnetic field substantially aligned with the direction of the storage layer is applied. The presence of magnetic field stabilizes the storage layer and increases its programming current, shifting the write characteristics to the right and increasing the memory error rate under fixed bias conditions.

Figure 5:
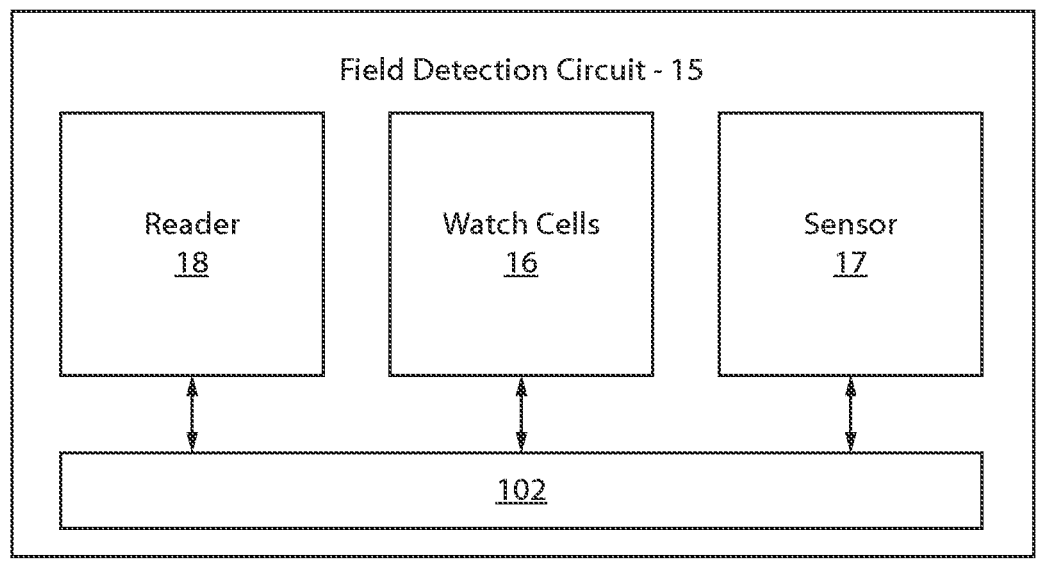
FIG. 5 is block diagram illustrating one embodiment of a field detection circuit, in accordance with one embodiment of the present disclosure.

Referring to FIG. 2, external magnetic fields are detected by the field detection circuit 15. FIG. 5 is a block diagram illustrating one embodiment of a field detection circuit 15. The field detection circuit 15 can be provided by magnetic field sensors 17. In other embodiments, the field detection circuit 15 may include magnetic position and distance sensors, magnetic proximity switches, magnetic force and torque sensors, magnetic flowmeters and current sensors. The magnetic field sensor 17 is positioned proximate to the memory cell array. The reader 18, watch cells 16, and the sensor 17 depicted in the field detection circuit 15 are interconnected by a system bus 102. The system bus 102 can provide for interconnectivity with the processing system 400 depicted in FIG. 12.

The field detection circuit 15 may also be provided by watch cells 16. A "watch cell" is a magnetic tunnel junction device used for detection of external magnetic fields. The watch cell 16 is positioned proximate to the memory cell (also referred to a bit cells). The watch cell is designed to register a change in electrical programing in response to external magnetic fields. By detecting the change in electrical programming of the watch cell 16, the presence of an external magnetic field is detected.

In some embodiments, the watch-cells 16 have a lower switching field than the memory cells, e.g., MRAM bits. In other embodiments, to provide watch-cells with lower switching field than the memory cells, e.g., MRAM bits, the watch cells may have a different magnetic anisotropy field (Hk) characteristics than the memory cells.

In other embodiments, to provide that watch cells 16 for detecting external magnetic fields in the vicinity of memory cells 30, the watch cells 16 may be configured to have a larger diameter than the memory cells 30. The watch cells 16 may have a larger diameter biased under nominal voltage conditions. In this example, in the absence of magnetic field, the current applied to the watch cells 16 having the larger diameter geometry when compared to the memory cells 30 is not large enough to program the watch cells 16, however that same level of current would program the memory cells. Further, when subjected to the presence of an external magnetic field, at least some of the watch cells 16 will be programmed at that same current that previously was insufficient to program the watch cells 16. In this example, to determine the presence of an external magnetic field, the fraction of programmed cells is monitored. If the fraction of programmed cells for the watch cells 16 reaches a threshold when subjected to the current that is known not to be sufficient to program the watch cells 16 due to their greater diameter dimensions, the conditions warrant field compensation by adjusting the write bias in the array.

In another embodiment, the watch cells 16 in the field detection circuit 15 employ watch-cells 16 biased at lower voltage than normal, e.g., a write error rate (WER) of $1 \times 10^{-3}$. In this example, to determine the presence of an external magnetic field, the error rate would be monitored over time, and the write bias is adjusted to keep the write error rate (WER) constant. In some embodiments, in which the write error rate (WER) is monitored to determine the presence of an external magnetic field, additional array of bits for dedicated watch cells 16 are not required. By biasing the watch cells at a higher bit error rate (BER) point, it is possible to detect the presence of a magnetic field in fewer writes and improve the response time of the field detection circuit.

In each of the aforementioned examples, the sensing elements, e.g., watch cells 16, magnetic field sensors 17, or elements for measuring write error rates (WER), or a combination of the aforementioned sensing elements are periodically monitored. The periodic monitoring of the sensing elements of the field detection circuit 15 may be effectuated using a reader 18, which may include a clock that schedules a monitor cycle. The reader 18 may also include at least one hardware processor and memory, the memory storing instructions to be executed by the hardware processor of the reader 18 for monitoring the watch cells 16 in determining the presence of external magnetic fields. In some embodiments, a field detection circuit 15 can periodically read the state of the watch-cells and look for disruptions indicative of external magnetic fields.

Figure 6:
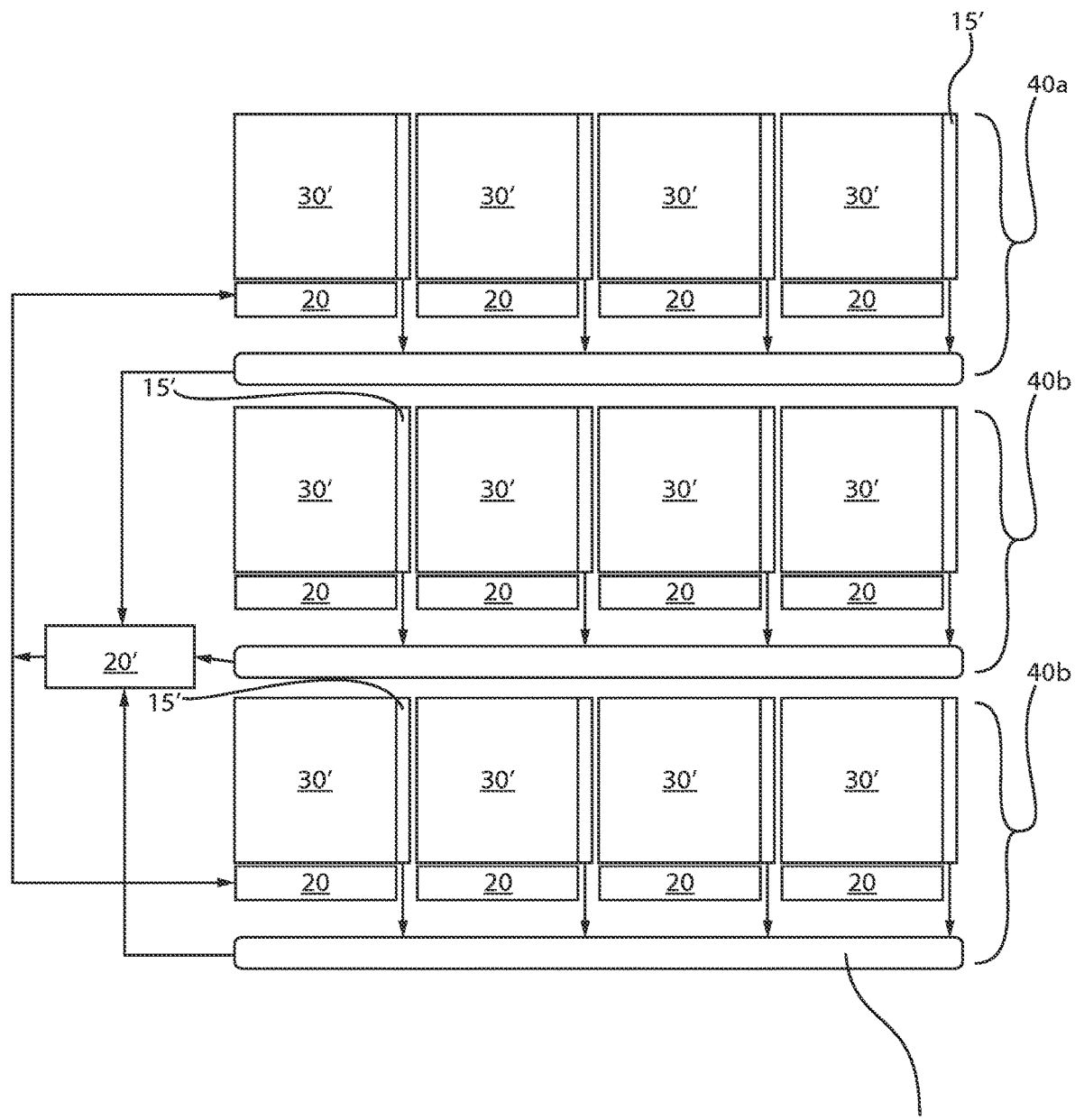
FIG. 6 is a schematic diagram of an array of memory cells including a field detection circuit for measuring external magnetic fields that includes watch cells having a different diameter than the memory cells, and write driver controller for controlling the write voltage to provide field compensation, in accordance with one embodiment of the present disclosure.

FIG. 6 depicts an array of memory cells including a field detection circuit for measuring external magnetic fields that includes watch cells having a different diameter than the memory cells, and write driver controller for controlling the write voltage to provide field compensation. Memory arrays are built as an array of bit cells, each of which stores 1 bit of data. The memory cells of the arrays depicted in FIG. 6 may be magnetic random access memory cells. In some embodiments, the memory cells includes an MRAM architecture that includes a cell with an access transistor and a MTJ (1T1MTJ) in the array. In the array, each bit cell is connected to a wordline and a bitline. For each combination of address bits, the memory asserts a single wordline that activates the bit cells in that row.

Referring to FIG. 6, a plurality of memory banks 40a, 40b, 40c are depicted, wherein in each memory bank 40a, 40b, 40c there are many bit cell (BC) arrays 30'. In the embodiment that is depicted in FIG. 6, each array 30' may have a supplemental column 15' with magnetic tunnel junctions (MTJs) having a larger diameter or different magnetic anisotropy field (Hk) characteristics than the bit cells that provide the memory cell 30. The supplemental column 15' provides the watch cells 16 for the field detection circuit 15. In the embodiment that is depicted in FIG. 6, the watch cells 16 may be biased with the same conditions as the bit cell (BC) array 30'. In some examples, due to the larger diameter of the MTJ for the watch cells 16 in the supplemental column 15' relative to the MTJs for the bit cell (BC) arrays, the watch cells 16 in the supplemental column 15' need the presence of an external magnetic field to switch, e.g., be programmed. In further examples, due to the different magnetic anisotropy field (Hk) characteristics for the watch cells 16 in the supplemental column 15' relative to the MTJs for the bit cell (BC) arrays, the watch cells 16 in the supplemental column 15' need the presence of an external magnetic field to switch, e.g., be programmed.

It is noted that the in the embodiment depicted in FIG. 6 there are three bit cell (BC) array blocks 30'. It is noted that this example is provided for illustrative purposes only, and it is not intended that the present disclosure be limited to only this example. For example, any number of bit cell (BC) array blocks 30' may be employed with the methods and the structures that provide for external magnetic field compensation.

Figure 7:
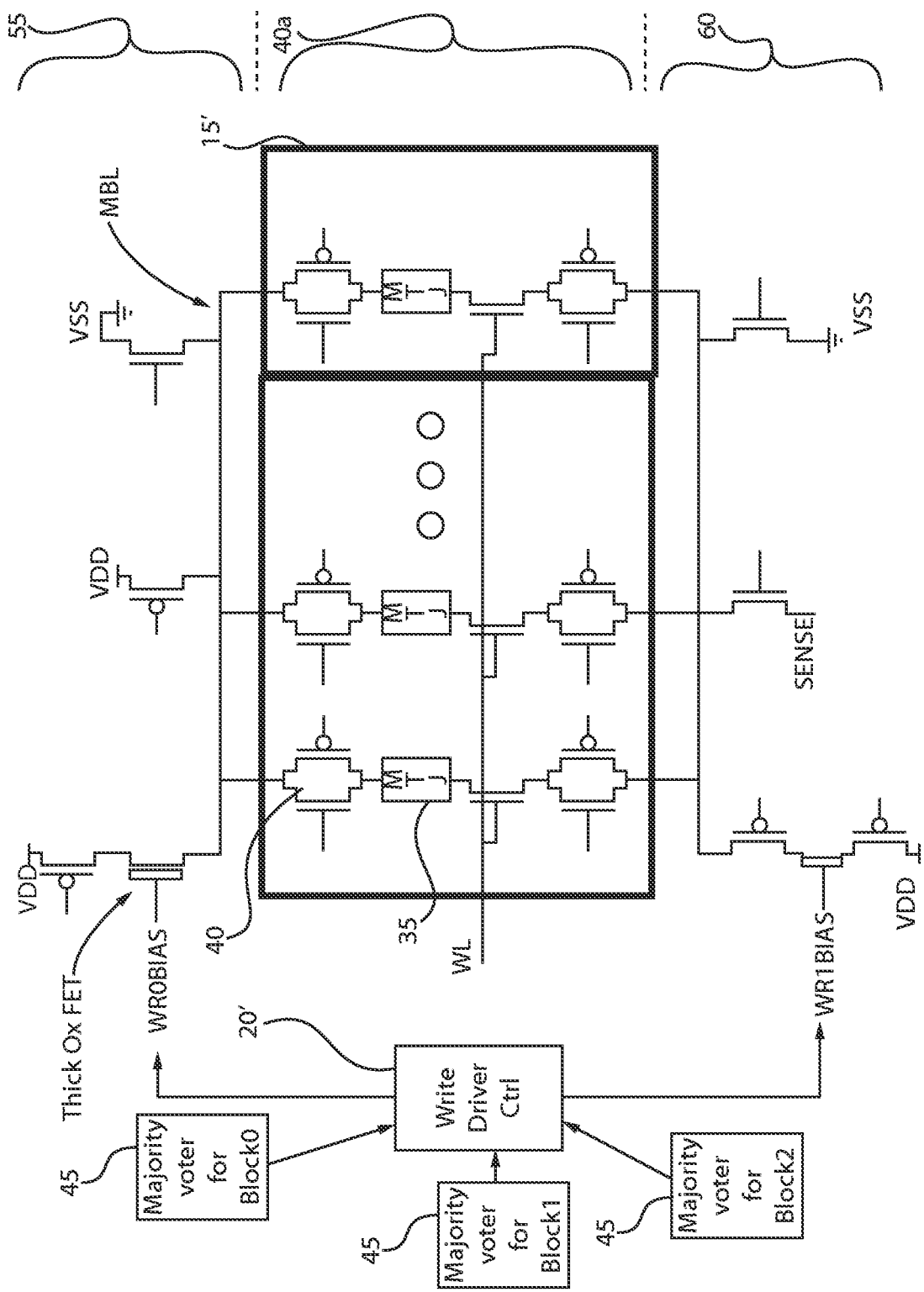
FIG. 7 is a circuit diagram of an MRAM array in accordance with one embodiment of the present disclosure.

Referring to FIG. 6, in some embodiments, for further accuracy of determining whether the watch cells 16 in the supplemental column 15' are switching, i.e., programmed, in response to an external magnetic field, there is a majority voter circuit 45. that will detect the fraction of the switched cells. A majority voter circuit 45, contains a set of combinatory logic gates with 'n' inputs coming from the watch cells read data of each block (40a, 40b, 40c). It has one output which returns true '1' if and only if more than 50% of its inputs are true. The use of majority voter increases the accuracy of the external magnetic field detection by taking into account the process variation form array to array (30'). Based on the output of different majority voter circuits 45, a write driver controller 20', shmoos the voltage of the write driver, as shown in FIG. 7. The write driver controller 20' consists of a voltage divider which outputs a voltage value specific to its inputs (the digital data fed from the majority voter circuits).

To determine the presence of an external magnetic field the watch cells in the supplemental columns 15' may be monitored. The watch cell diameters/Hk may be different from block to block. In the embodiment that is depicted in FIG. 6, each of the bit cell (BC) arrays includes a supplemental column 15' including watch cells 16 having a diameter with a different degree of deviation from the diameter of the memory cells 30 in the bit cell (BC) arrays. For example, the memory cells 30 in the bit cell arrays 30' may include magnetic tunnel junction structures (MJTs) having a same diameter, which can be referred to a nominal diameter ("nom Dia"). In the embodiment depicted in FIG. 6, the watch cells 16 in the supplemental column 15' of the first block (block 0) has magnetic tunnel junctions (MTJ) with a diameter that is larger than the nominal diameter of the memory cells 30 in the bit cell array 30' by a differential value (Δ). In the adjacent block of bit cell (BC) arrays 40b, the watch cells 16 in the supplemental column 15' have a diameter that is larger than the nominal diameter of the memory cells in the bit cell array 30' by the differential value (Δ) by 2, i.e., the watch cells 16 have a diameter of the nominal diameter plus two times the differential value (nom Dia+2Δ). In the next block of bit cell (BC) arrays 40c, the watch cells 16 in the supplemental column 15' have a diameter that is larger than the nominal diameter of the memory cells in the bit cell array 30' by the differential value (Δ) by 3, i.e., the watch cells 16 have a diameter of the nominal diameter plus three times the differential value (nom Dia+3Δ). In this example, every block watch cell will detect a higher value of the external magnetic field. The larger the different in the diameter the greater the external magnetic field needed to program the watch cell 16.

Referring to FIG. 6, a write driver control circuit 20' will tune the write current by dynamically trimming the write driver 20 based on the inputs from the majority voter circuits 45 from each block 40a, 40b, 40c. As illustrated in FIG. 4, when a field is applied opposite to the direction of the write state, e.g., when trying to write a "0", but the field stabilizes the "1" state, the write current needs to be increased. In this case, the majority voter detects bits switching to the "1" state.

FIGS. 7-10 illustrate some embodiments of the MRAM array, e.g., memory cells 30 in the blocks 40a, 40b, 40c, and biasing in connection with the write driver controller. FIG. 7 is a circuit diagram of one embodiment of an MRAM array as employed in the blocks depicted in FIG. 6. The memory cells 30 include a magnetic tunnel junction (MJT) 35 and one or more access transistor 40. Each memory cell 30 is associated with a bit line. The MRAM array and an on pitch bit line (BL)/source line (SL) switch correspond to a single bit line (BL) and sense line (SL) combination. A word line (WL) is in communication with access transistors to the magnetic tunnel junctions. In the embodiment depicted in FIG. 7, the supplemental column 15' includes watch cells having the nominal diameter plus the differential, as described above with the description of block 40a.

Still referring to FIG. 7, the MRAM array further includes circuits for bit line multiplexing (BL MUXING) 55 and sense line multiplexing (SL MUXING) 60. Multiplexing describes the operation of sending one or more signals over a common transmission line at different times or speeds and as such, in which the device to do just that is called a Multiplexer. The multiplexer, shortened to "MUX", is a combinational logic circuit designed to switch one of several input lines through to a single common output line by the application of a control signal. In the embodiment depicted the MUX includes MOSFET's or relays to switch the voltage or current inputs through to a single output.

The circuits for bit line multiplexing (BL MUXING) 55 and sense line multiplexing (SL MUXING) 60 are in electrical communication with the write driver controller 20. The write driver controller 20 receives input from the majority voter 45 for each of the blocks of arrays 40a, 40b, 40c. The write driver controller 20 tunes the write current by dynamically trimming the write driver 20 based on the inputs from the majority voter circuits 45 from each block 40a, 40b, 40c.

Figure 8:
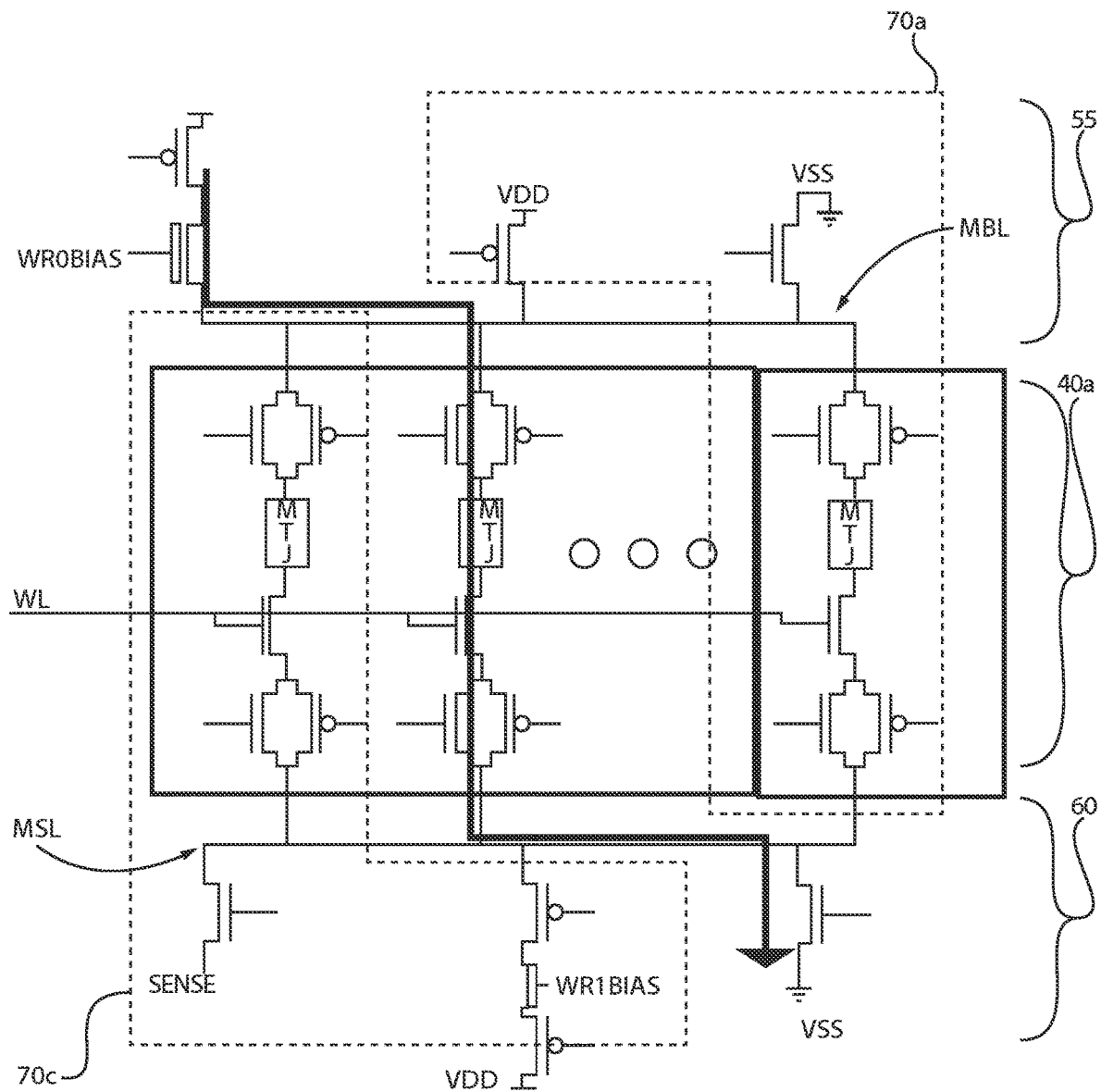
FIG. 8 is a circuit diagram of an MRAM array illustrating biasing to provide a write function to provide a "0" bit data storage value, in accordance with one embodiment of the present disclosure.
Figure 9:
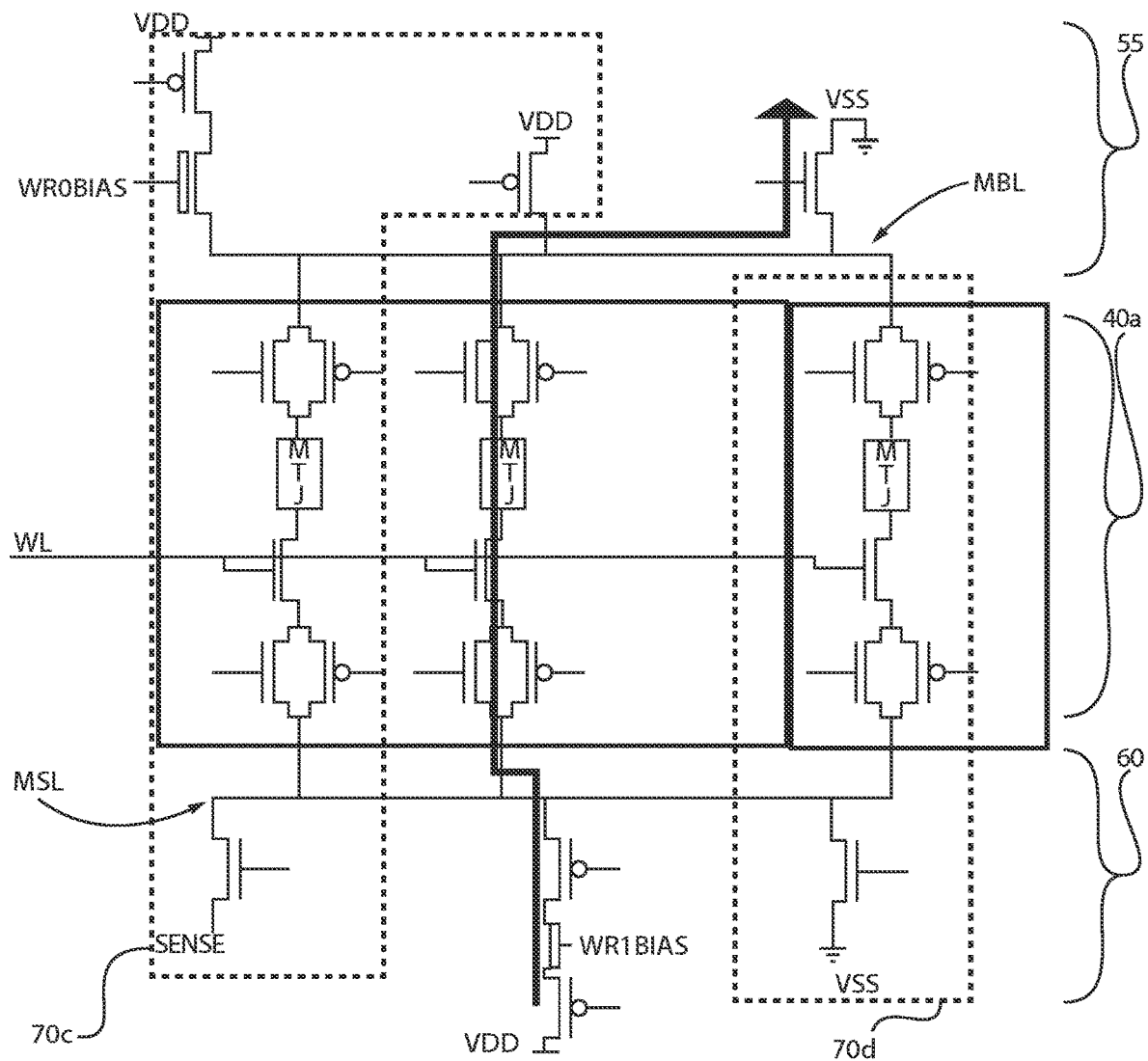
FIG. 9 is a circuit diagram of an MRAM array illustrating biasing to provide a write function to provide a "1" bit data storage value, in accordance with one embodiment of the present disclosure.
Figure 10:
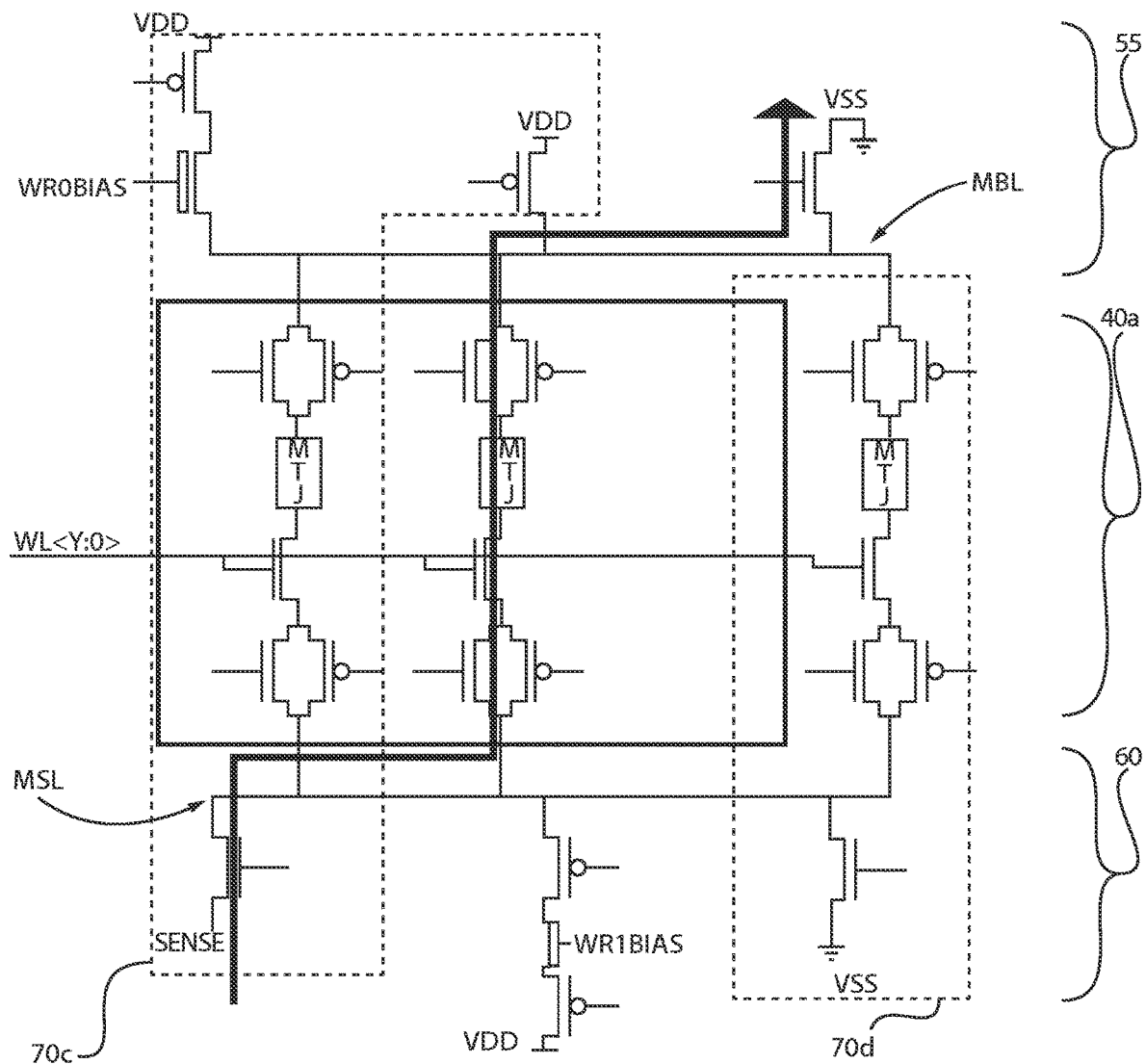
FIG. 10 is a circuit diagram of an MRAM array illustrating biasing for a read function, in accordance with one embodiment of the present disclosure.

FIGS. 8-10 illustrate how the array depicted in FIG. 7 is biased to provide write and read memory functions, and to provide that the supplemental column 15' includes watch cells 16 is monitoring for external magnetic currents.

FIG. 8 is a circuit diagram of an MRAM array illustrating biasing to provide a write function to provide a "0" bit data storage value. In FIG. 8, a single write line (WL) is selected, and the voltage is set to be equal to the WL activation voltage. The circuit for bit line multiplexing (BL MUXING) 55 is bias with a thick OX field effect transistor (WR0BIAS), and the select line multiplexing (SL MUXING) is set to force low. The unselected portions of the array are identified by regions 70a, 70b. The write driver controller 20 sets the above noted conditions for writing "0". As noted, the write driver control circuit 20' will tune the write current by dynamically trimming the write driver 20 based on the inputs from the majority voter circuits 45 from each block 40a, 40b, 40c in order to compensate for the presence of an external magnetic field.

FIG. 9 is a circuit diagram of an MRAM array illustrating biasing to provide a write function to provide a "1" bit data storage value. In FIG. 9, a single write line (WL) is selected, and the voltage is set to be equal to the WL activation voltage. The circuit for bit line multiplexing (BL MUXING) 55 is set to force low, and the select line multiplexing (SL MUXING) is bias with a thick OX field effect transistor (WR1BIAS). The unselected portions of the array are identified by regions 70c, 70d. The write driver controller 20 sets the above noted conditions for writing "1". As noted, the write driver control circuit 20' will tune the write current by dynamically trimming the write driver 20 based on the inputs from the majority voter circuits 45 from each block 40a, 40b, 40c in order to compensate for the presence of an external magnetic field.

FIG. 10 is a circuit diagram of an MRAM array illustrating biasing for a read function, in accordance with one embodiment of the present disclosure. In FIG. 10, a single write line (WL) is selected, and the voltage is set to be equal to the WL activation voltage The circuit for bit line multiplexing (BL MUXING) 55 is set to force low, and the select line multiplexing (SL MUXING) is connected to the sense amplifier. The unselected portions of the array are identified by regions 70e, 70d. The write driver controller 20 sets the above noted conditions for reading.

Figure 11:
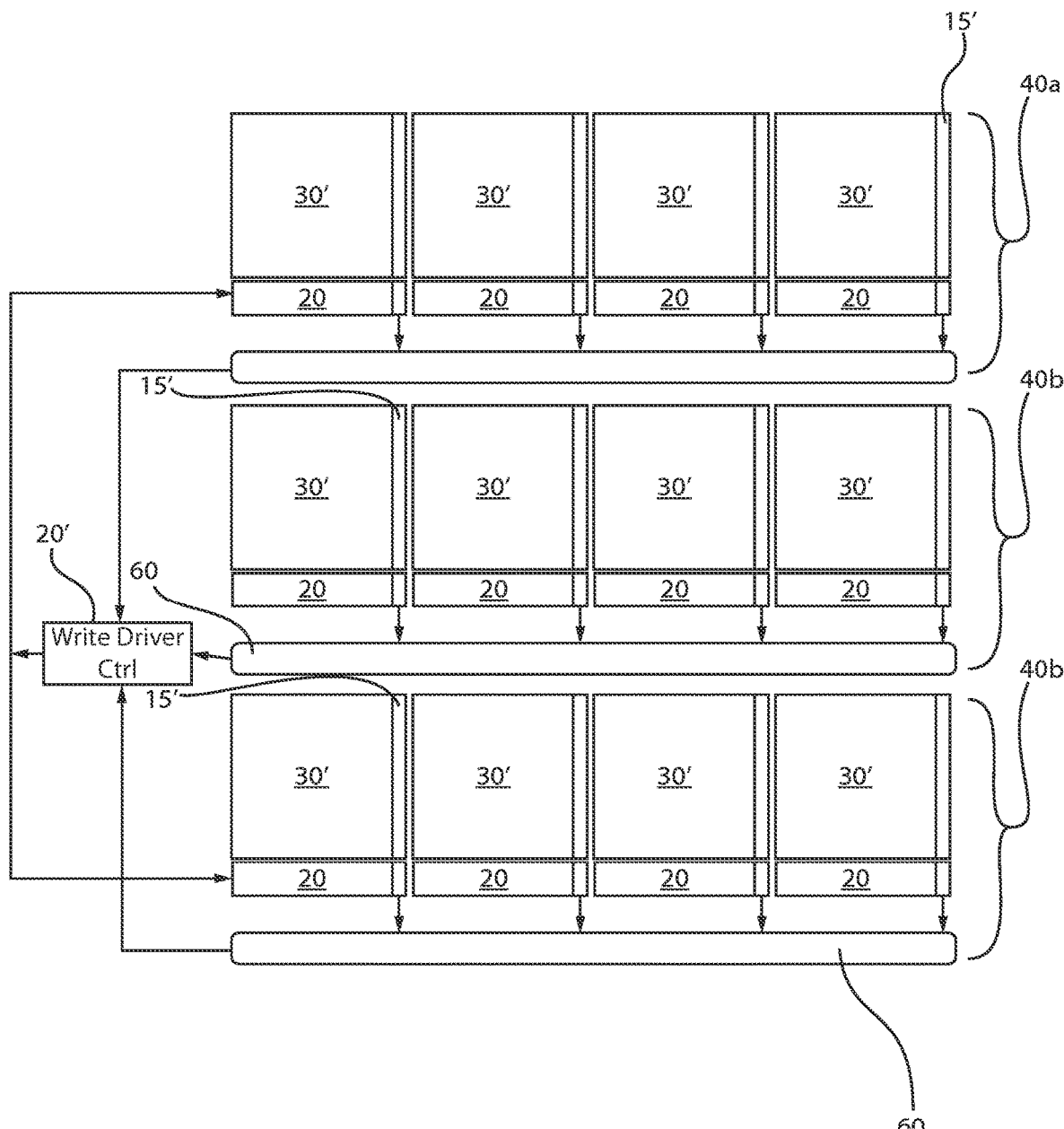
FIG. 11 is a schematic diagram of an array of memory cells in which external magnetic fields are detected by monitoring changes in write error rate, and write driver controller for controlling the write voltage to provide field compensation, in accordance with one embodiment of the present disclosure.

FIG. 11 depicts another embodiment of the present disclosure in which an external magnetic field is sensed in the presence of memory cells, and the write voltage is adjusted to compensate for the external magnetic field. FIG. 11. is a schematic diagram of an array of memory cells in which external magnetic fields are detected by monitoring changes in write error rates. Similar to the embodiment depicted in FIG. 7, the memory banks depicted in FIG. 11 contains many BC arrays. Every array has a supplementary column 15' with MTJs on nominal size and electrically connected to a separate write path. In this embodiment, the watch cells are biased at sub nominal conditions compared to the bit cells in the blocks of arrays 40a, 40b, 40c. In some embodiments, a counter 60 is used to monitor the WER error rate of the watch cells and is periodically reset. For example, the counter 60 may monitor the WER error rate every 100-1000 write cycles. In the embodiment depicted in FIG. 11, when the WER error rate indicates the presence of an external magnetic field, the write driver control circuit will tune the write current by dynamically trimming the write driver based on the output of the counter.

In yet another embodiment, an alternative embodiment would be to shrink the access transistor to the watch cells. By shrinking the access transistor, the channel length is decreased and the write bias provided to the MTJs is reduced. Therefore using the same bias conditions for the BC arrays and watch cell arrays will result in a higher BER for the watch cell arrays. The mode of operation of this embodiment is similar to the previous embodiment but it provides additional simplicity since there is no need to specifically trim the bias conditions for the watch cells. In response to sensing the programming of the magnetic tunnel junctions of the watch cells 16, the write driver control circuit can tune the write current by dynamically trimming the write driver 20 to compensate for the external magnetic field.

The methods and systems of the present disclosure advantageously allows for continuous operation of the chip even when a magnetic field is detected. A circuit design including a field detection device coupled to the write driver will adjust the programming voltage to offset the impact of the external magnetic field on the chip error rate.

Figure 12:
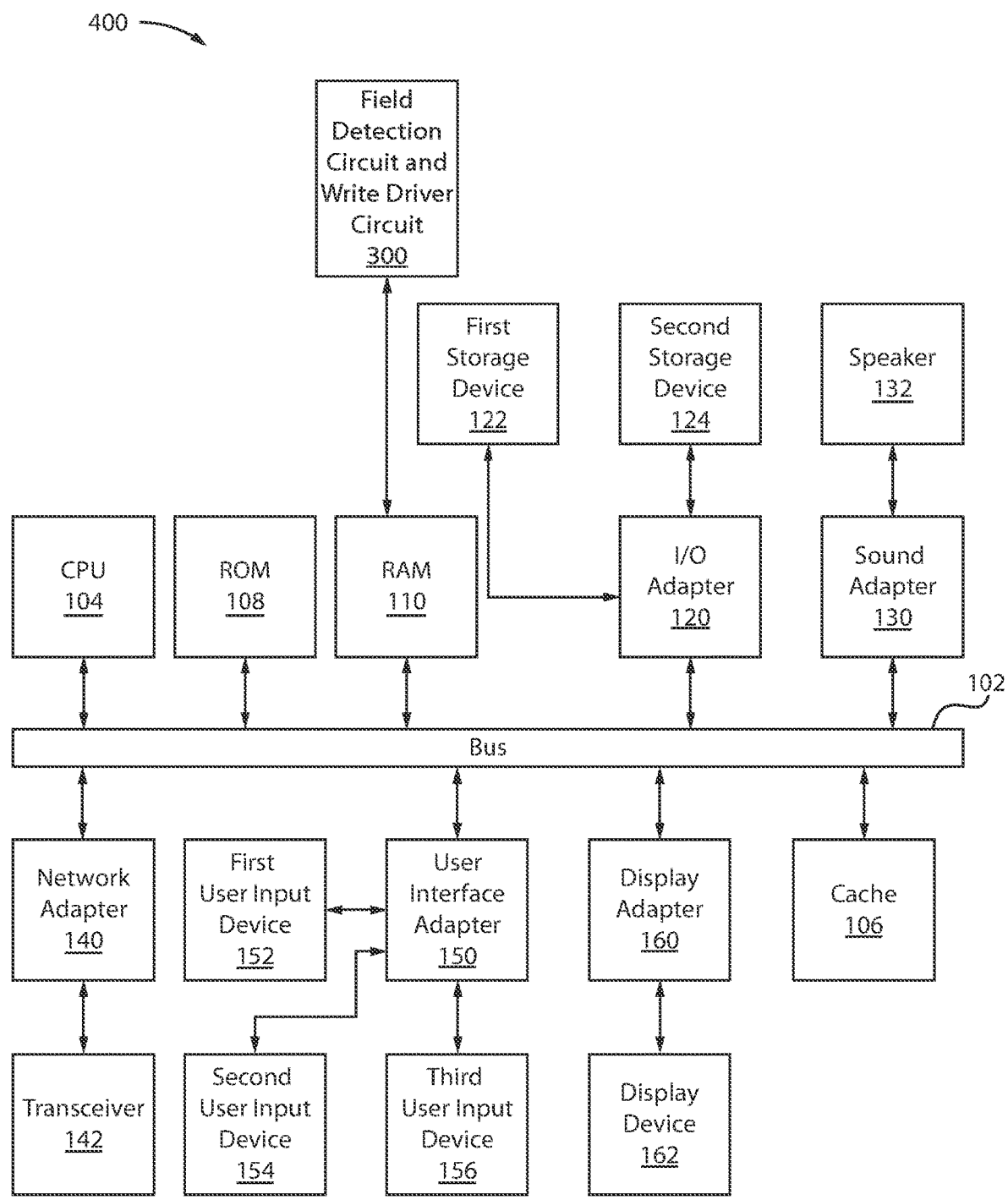
FIG. 12 is a block diagram illustrating a processing system that can incorporate the system for application migration that is depicted in FIG. 3, in accordance with one embodiment of the present disclosure.

Additionally, the field detection circuit 15 and write driver 20 (collectively identified with reference number 300) that is depicted in FIGS. 2 and 5 may be integrated into the processing system 400 depicted in FIG. 12. The processing system 400 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102. The bus 102 interconnects a plurality of components has will be described herein.

The processing system 400 depicted in FIG. 12, may further include a first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 400.

Of course, the processing system 400 may also include other elements (not shown), as readily contemplated by one of skill in the art, as well as omit certain elements. For example, various other input devices and/or output devices can be included in processing system 400, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 400 are readily contemplated by one of ordinary skill in the art given the teachings of the present invention provided herein.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

These and other variations of a hardware processor subsystem are also contemplated in accordance with embodiments of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method that uses a write driver with magnetic field compensation performance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for compensating for external magnetic fields in memory devices comprising:
    positioning at least one external magnetic field sensing element adjacent to at least one array of memory cells, wherein a write driver is in electrical communication with said at least one external magnetic field sensing element and said at least one array of memory cells, wherein the at least one external magnetic field sensing element is a watch cell that comprises a watch cell access transistor to a watch cell magnetic tunnel junction that has different bias conditions than a bit cell access transistor to a bit cell magnetic tunnel junction;
    monitoring the at least one external magnetic field sensing element for signals indicative of the present of an external magnetic field; and
    adjusting a write current to the at least one array of memory cells by trimming the write driver.

2. The method of claim 1, wherein the array of memory cells comprises bit cells having a bit cell magnetic tunnel junction (MTJ).

3. The method of claim 1, wherein the watch cell magnetic tunnel junction (MTJ) structure having a greater diameter than the bit cell magnetic tunnel junction (MTJ).

4. The method of claim 1, wherein the watch cell magnetic tunnel junction having magnetic anisotropy field (Hk) characteristics different from magnetic anisotropy field (Hk) characteristics of the bit cell magnetic tunnel junction (MTJ).

5. The method of claim 1, wherein the watch cell access transistor to the watch cell magnetic tunnel junction that has different dimensions than a bit cell access transistor to a bit cell magnetic tunnel junction.

6. The method of claim 1, wherein the watch cell access transistor to the watch cell magnetic tunnel junction that has different bias conditions than a bit cell access transistor to a bit cell magnetic tunnel junction.

7. The method of claim 1, wherein monitoring the at least one external magnetic field sensing element for signals indicative of the present of an external magnetic field comprises measuring programming of the watch cell when a bit cell is not correspondently programmed at a substantially same time.

8. The method of claim 1, wherein monitoring the at least one external magnetic field sensing element for signals indicative of the present of an external magnetic field comprises measuring changes in write error rates (WER) of the watch cells.

9. The method of claim 1, wherein said external magnetic field sensing element is a magnetic field sensor.

10. The method of claim 1, wherein the watch cells are positioned in a periphery of a block of bit cell arrays.

11. A method for compensating for external magnetic fields in memory devices comprising:
    positioning at least one watch cell adjacent to at least one array of memory cells, wherein a write driver is in electrical communication with said at least one external magnetic field sensing element and said at least one array of memory cells, wherein the watch cell access transistor to a watch cell magnetic tunnel junction that has different bias conditions than a bit cell access transistor to a bit cell magnetic tunnel junction;
    monitoring the at least one watch cell for variations in write error rates (WER) from a baseline write error rate, wherein said variations signal the present of an external magnetic field; and
    adjusting a write current to the at least one array of memory cells by trimming the write driver to compensate for external magnetic fields measured by monitoring said at least one watch cell.

12. A memory device comprising:
    at least one block of bit cells including a plurality of memory cells and at least one supplemental group of watch cells in periphery of the memory array, wherein the at least one supplement group of watch cells measures external magnetic fields in proximity to the plurality of memory cells, wherein the watch cells comprises a watch cell access transistor to a watch cell magnetic tunnel junction that has different bias conditions than a bit cell access transistor to a bit cell magnetic tunnel junction;
    a write driver circuit in electrical communication with at least the plurality of memory cells; and
    a counter for recording when the at least one supplemental group of watch cells measures the external magnetic fields, the counter is in electrical communication with the write driver circuit, wherein a write driver of the write driver circuit adjusts a write current to the plurality of memory cells to compensate for the external magnetic field.

13. The memory device of claim 12, wherein the plurality of memory cells comprises bit cells having a bit cell magnetic tunnel junction (MTJ).

14. The memory device of claim 13, wherein the watch cell magnetic tunnel junction (MTJ) structure having a greater diameter than the bit cell magnetic tunnel junction (MTJ).

15. The memory device of claim 12, wherein monitoring the at least one external magnetic field sensing element for signals indicative of the present of an external magnetic field comprises measuring programming of the watch cells when a bit cell is not correspondently programmed at a substantially same time.

16. The memory device of claim 12, wherein monitoring the at least one external magnetic field sensing element for signals indicative of the present of an external magnetic field comprises measuring changes in write error rates (WER) of the watch cells.

17. The memory device of claim 12, wherein the watch cells are positioned in periphery of a block of bit cell arrays.

18. A memory device comprising:
   at least one block of bit cells including a plurality of memory cells and at least one supplemental group of watch cells in periphery of the memory array, the supplemental group of watch cells comprise a watch cell access transistor to a watch cell magnetic tunnel junction that has different bias conditions than a bit cell access transistor to a bit cell magnetic tunnel junction, wherein the at least one supplement group of watch cells measures external magnetic fields in proximity to the plurality of memory cells, wherein the plurality of memory cells comprises bit cells having a bit cell magnetic tunnel junction (MTJ), and the supplemental group of watch cells include a magnetic tunnel junction (MTJ) structure having a greater diameter than the bit cell magnetic tunnel junction (MTJ); and
   a write driver circuit in electrical communication with at least the plurality of memory cells, wherein a write driver of the write driver circuit adjusts a write current to the plurality of memory cells to compensate for the external magnetic field.

19. The memory device of claim 18, wherein the watch cells are positioned in periphery of a block of bit cell arrays.

20. A memory device comprising:
   at least one block of bit cells including a plurality of memory cells and at least one supplemental group of watch cells in periphery of the memory array, the supplemental group of watch cells comprise a watch cell access transistor to a watch cell magnetic tunnel junction that has different bias conditions than a bit cell access transistor to a bit cell magnetic tunnel junction, the at least one supplement group of watch cells measures external magnetic fields in proximity to the plurality of memory cells, wherein the plurality of memory cells comprises bit cells having a bit cell magnetic tunnel junction (MTJ), and the watch cells comprise a watch cell magnetic tunnel junction having magnetic anisotropy field (Hk) characteristics different from magnetic anisotropy field (Hk) characteristics of the bit cell magnetic tunnel junction (MTJ).

21. The memory device of claim 20, wherein the watch cells are positioned in periphery of a block of bit cell arrays.

22. The memory device of claim 21, further comprising a counter for recording when the at least one supplemental group of watch cells measures the external magnetic fields.

* * * * *